United States Patent
Leobandung et al.

(10) Patent No.: US 10,389,090 B2
(45) Date of Patent: Aug. 20, 2019

(54) LATERAL GROWTH OF EDGE-EMITTING LASERS

(71) Applicant: INTERNATIONAL BUSINESS MACHINES CORPORATION, Armonk, NY (US)

(72) Inventors: Effendi Leobandung, Stormville, NY (US); Ning Li, White Plains, NY (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/819,848

(22) Filed: Nov. 21, 2017

(65) Prior Publication Data

US 2019/0157845 A1    May 23, 2019

(51) Int. Cl.
| | |
|---|---|
| *H01S 5/40* | (2006.01) |
| *H01S 5/323* | (2006.01) |
| *H01S 5/22* | (2006.01) |
| *H01S 5/02* | (2006.01) |
| *H01L 21/02* | (2006.01) |
| *H01S 5/343* | (2006.01) |

(52) U.S. Cl.
CPC ........ *H01S 5/4031* (2013.01); *H01L 21/0243* (2013.01); *H01L 21/02381* (2013.01); *H01L 21/02433* (2013.01); *H01L 21/02639* (2013.01); *H01S 5/021* (2013.01); *H01S 5/2206* (2013.01); *H01S 5/323* (2013.01); *H01S 5/34313* (2013.01); *H01S 5/34353* (2013.01)

(58) Field of Classification Search
None
See application file for complete search history.

(56) References Cited

U.S. PATENT DOCUMENTS

| | | |
|---|---|---|
| 5,360,761 A | 11/1994 | Andrews |
| 7,282,732 B2 | 10/2007 | Gray et al. |
| 8,409,888 B2 | 4/2013 | Rumpler et al. |
| 8,824,837 B2 | 9/2014 | Ren et al. |
| 8,981,534 B2 | 3/2015 | Li et al. |
| 9,042,424 B2 | 5/2015 | Kim et al. |
| 9,118,160 B2 | 8/2015 | Park et al. |
| 9,373,755 B2 * | 6/2016 | Yu .......................... H01L 33/48 |
| 9,407,066 B2 | 8/2016 | Cheng et al. |
| 2003/0178702 A1 * | 9/2003 | Sawaki .................. C30B 25/02 257/622 |
| 2005/0199870 A1 | 9/2005 | Gray et al. |

(Continued)

FOREIGN PATENT DOCUMENTS

| | | |
|---|---|---|
| JP | 08-195356 A | 7/1996 |
| NL | 190943 C | 11/1994 |

*Primary Examiner* — Tod T Van Roy
(74) *Attorney, Agent, or Firm* — Tutunjian & Bitetto, P.C.; L. Jeffrey Kelly

(57) ABSTRACT

A method of forming a pair of edge-emitting lasers is provided. The method includes forming a mesa from a substrate, forming a cover layer on the substrate around the mesa, and forming a first barrier layer on each of opposite sidewalls of the mesa. The method further includes forming a quantum well layer on each of the barrier layers, forming a second barrier layer on each of the quantum well layers, and forming a cladding layer on each of the second barrier layers.

20 Claims, 10 Drawing Sheets

(56) References Cited

U.S. PATENT DOCUMENTS

| | | | |
|---|---|---|---|
| 2007/0170417 A1 | 7/2007 | Bowers | |
| 2008/0308835 A1* | 12/2008 | Pan | B82Y 20/00 257/103 |
| 2011/0243496 A1* | 10/2011 | Jones | G02B 6/124 385/14 |
| 2011/0261854 A1* | 10/2011 | Sasaoka | B82Y 20/00 372/45.011 |
| 2015/0171266 A1 | 6/2015 | Li et al. | |

* cited by examiner

LATERAL GROWTH OF EDGE-EMITTING LASERS

BACKGROUND

Technical Field

The present invention generally relates to the formation of a pair of edge-emitting semiconductor lasers, and more particularly to the lateral growth of a pair of III-V semiconductor edge-emitting lasers with tuned wavelengths.

Description of the Related Art

Semiconductor lasers can include an active material that can undergo spontaneous emission of photons when pumped optically or electrically, and passive layers on opposite sides of the active material. III-V semiconductors have been used to form the passive and active layers of the laser on III-V substrates.

The direct growth of III-V materials on silicon generally results in crystal dislocations and defects which shorten the lifetime of the laser. There are lattice constant mismatches and thermal expansion coefficient mismatches between the III-V semiconductor layers and the silicon surface that can result in these dislocations and defects. A means of forming multiple semiconductor lasers from III-V materials on a silicon surface with low defect densities are, therefore, still sought.

SUMMARY

In accordance with an embodiment of the present invention, a method of forming a pair of edge-emitting lasers is provided. The method includes forming a mesa from a substrate. The method further includes forming a cover layer on the substrate around the mesa. The method further includes forming a first barrier layer on each of opposite sidewalls of the mesa. The method further includes forming a quantum well layer on each of the barrier layers. The method further includes forming a second barrier layer on each of the quantum well layers. The method further includes forming a cladding layer on each of the second barrier layers.

In accordance with another embodiment of the present invention, a method of forming a pair of edge-emitting lasers is provided. The method includes forming a mesa from a substrate. The method further includes doping the mesa with an n-type or a p-type dopant. The method further includes forming a cover layer on the substrate around the mesa. The method further includes forming a first barrier layer on each of opposite sidewalls of the mesa, wherein the first barrier layers are formed on the opposite sidewalls of the mesa by heteroepitaxial growth. The method further includes forming a quantum well layer on each of the barrier layers, and forming a second barrier layer on each of the quantum well layers.

In accordance with yet another embodiment of the present invention, a pair of edge-emitting lasers is provided. The pair of edge-emitting lasers includes a doped mesa on a substrate. The pair of edge-emitting lasers further includes a cover layer on the substrate around the doped mesa. The pair of edge-emitting lasers further includes a first barrier layer on each of opposite sidewalls of the doped mesa. The pair of edge-emitting lasers further includes a quantum well layer on each of the barrier layers, and a second barrier layer on each of the quantum well layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention generally relate to forming a pair of edge-emitting semiconductor lasers on a substrate, where the sidewalls of a mesa perpendicular to the substrate surface are used as a growth surface for the pair of lasers.

Embodiments of the present invention also generally relate to forming an aluminum-gallium-arsenide/indium-gallium-arsenide/aluminum-gallium-arsenide (AlGaAs/InGaAs/AlGaAs) semiconductor laser through lateral growth of the laser structure layers on a single-crystal silicon (111) sidewall. The epitaxial growth of the laser structure layers on the silicon (111) sidewall can provide high uniformity and low defect concentrations. The silicon mesa can act as a seed layer and a part of the waveguide for the semiconductor lasers.

Embodiments of the present invention also generally relate to fabricating the edge-emitting semiconductor lasers on a substrate in combination with the fabrication of other semiconductor structures (e.g., metal-oxide-semiconductor field effect transistors (MOSFETs), fin field effect transistors (FinFETs), etc.). The semiconductor lasers can be integrated with the other semiconductor structures to form optoelectronic circuits.

Exemplary applications/uses to which the present invention can be applied include, but are not limited to: light-emitting diodes (LEDs), semiconductor layer devices (e.g., laser diodes), optoelectronic circuits, optical storage media devices, barcode readers, and telecommunication transmitters.

It is to be understood that aspects of the present invention will be described in terms of a given illustrative architecture; however, other architectures, structures, substrate materials and process features and steps can be varied within the scope of aspects of the present invention.

Figure 1:
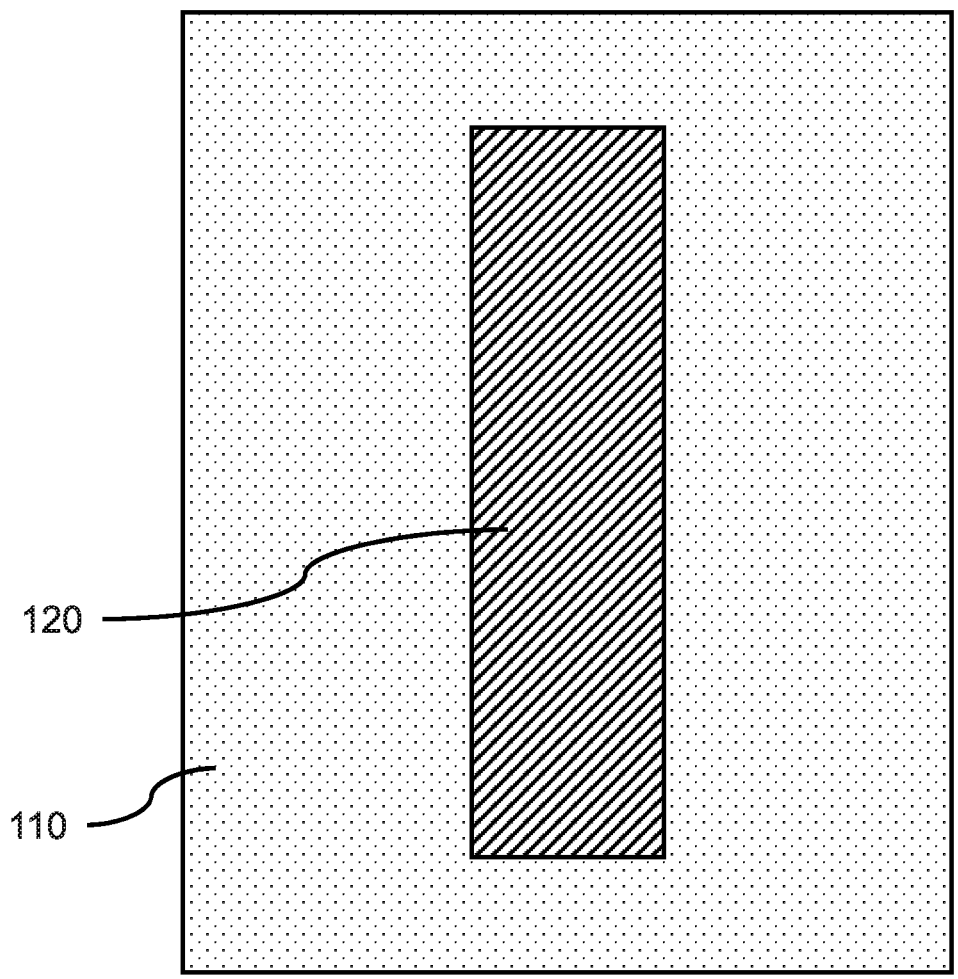
FIG. 1 is a top view showing a hardmask on a portion of a substrate, in accordance with an embodiment of the present invention.

Referring now to the drawings in which like numerals represent the same or similar elements and initially to FIG. 1, a hardmask on a portion of a substrate is shown, in accordance with an embodiment of the present invention.

In one or more embodiments, a hardmask 120 can be formed on a substrate 110, where the hardmask can be blanket deposited and patterned using lithographic processes. The hardmask can be a dielectric material, for example, silicon oxide (SiO), silicon nitride (SiN), silicon oxynitride (SiON), or combinations thereof.

In one or more embodiments, the substrate 110 can be a single crystal semiconductor, where III-V semiconductor materials can be heteroepitaxially grown on a crystal face of the substrate. In various embodiments, the substrate 110 can be a IV (e.g., silicon (Si), germanium (Ge)) or IV-IV (e.g., silicon-germanium (SiGe) or silicon carbide (SiC) semiconductor material. The substrate 110 can be a single crystal silicon wafer, where the single crystal silicon wafer can have a crystal orientation of (110).

In various embodiments, the hardmask 120 can have a width and length, where the width (i.e., narrower dimension parallel with the plane of the substrate 110) can be in the range of about 500 nm (nanometers) to about 2 um (micrometers), where the width can affect the leakage of light from an adjoining laser structure. The length (i.e., greater dimension parallel with the plane of the substrate 110) can be in the range of about 400 um to about 600 um, or about 500 um, where the length can affect the standing wave of an edge-emitting laser structure. The hardmask 120 can have sidewalls and endwalls, where the hardmask 120 masks a portion of the substrate surface, such that the substrate surrounding the hardmask 120 is exposed.

Figure 2:
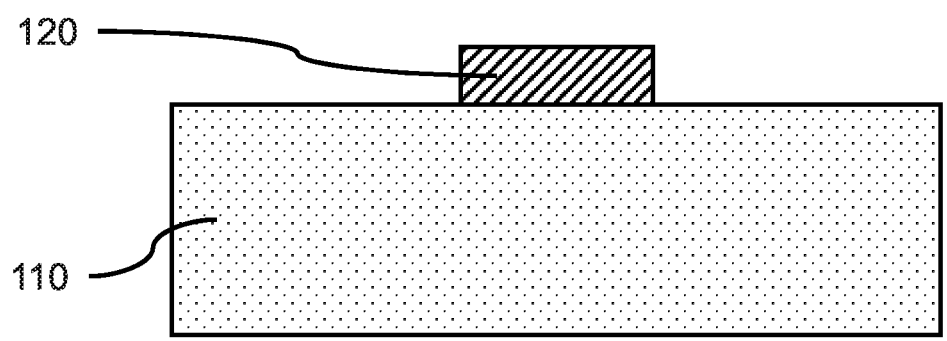
FIG. 2 is a cross-sectional side view showing the hardmask on a portion of the substrate, in accordance with an embodiment of the present invention.

FIG. 2 is a cross-sectional side view showing the hardmask on a portion of the substrate, in accordance with an embodiment of the present invention.

In one or more embodiments, the hardmask 120 can cover a portion of the substrate that will form a mesa, where the substrate around the hardmask is exposed.

Figure 3:
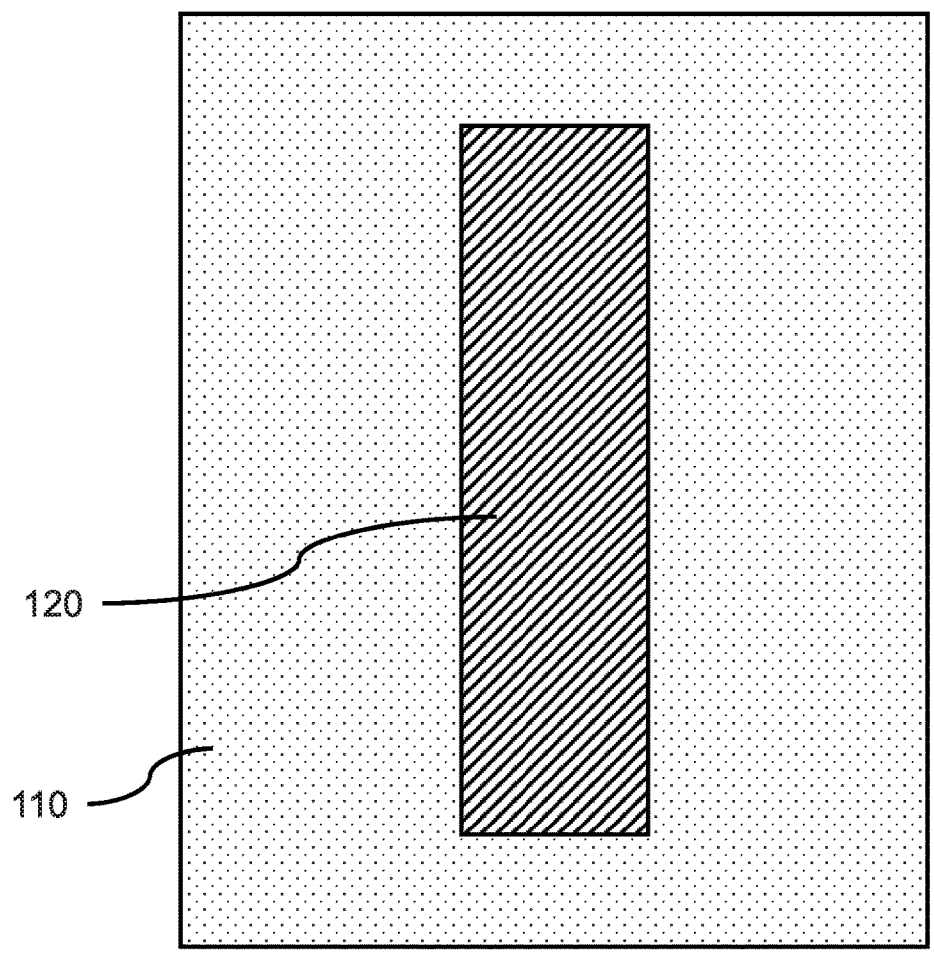
FIG. 3 is a top view showing the hardmask on a mesa surrounded by a recessed area of the substrate, in accordance with an embodiment of the present invention.

FIG. 3 is a top view showing the hardmask on a mesa surrounded by a recessed area of the substrate, in accordance with an embodiment of the present invention.

In one or more embodiments, a region of the substrate 110 surrounding the hardmask 120 can be removed to reduce the height of the substrate 110, while forming a mesa 115 from the portion of the substrate 110 covered by the hardmask 120.

The mesa 115 can have length and width dimensions equal to the hardmask dimensions, where the mesa dimensions can affect the wavelength of the light emitted by a laser structure based on the laser cavity size, and reduce interference of light generated on opposite sides of the mesa.

Figure 4:
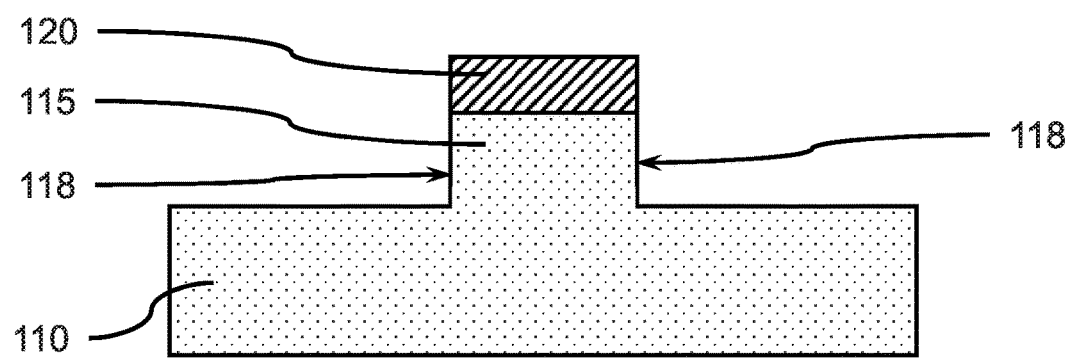
FIG. 4 is a cross-sectional side view showing the mesa formed by recessing the surrounding substrate, in accordance with an embodiment of the present invention.

FIG. 4 is a cross-sectional side view showing the mesa formed by recessing the surrounding substrate, in accordance with an embodiment of the present invention.

In one or more embodiments, the height of the substrate 110 can be reduced by about 500 nm to about 2 um, or about 1 um to about 1.5 um, so the mesa 115 has a height in the range of about 500 nm to about 2 um, or about 1 um to about 1.5 um, although other heights are also contemplated. The cross-section of the mesa can be square, where the width and height of the mesa are equal, or rectangular, where the width is greater than the height, or vice versa. The height of the substrate 110 can be reduced using a directional etch, for example, a crystallographic wet etch, such as tetramethyl ammonium hydroxide (TMAH), that can etch essentially straight sidewalls 118 for the mesa 115.

In various embodiments, the sidewalls 118 of the mesa 115 can have a predetermined crystal face formed from a crystalline substrate 110. The predetermined crystal face can provide a surface for heteroepitaxial growth of a laser structure laterally from the mesa sidewalls. The hardmask 120 and mesa 115 can be aligned with a crystal axis of the substrate 110 to form sidewalls 118 with the predetermined crystal face. In various embodiments, the predetermined crystal face for the heteroepitaxial growth of a III-V semiconductor material can be a {111} silicon crystal face. The mesa can act as a seed layer for lateral formation of laser structures, and as part of the waveguide of the edge-emitting lasers. In various embodiments, the mesa 115 can be single crystal silicon.

Figure 5:
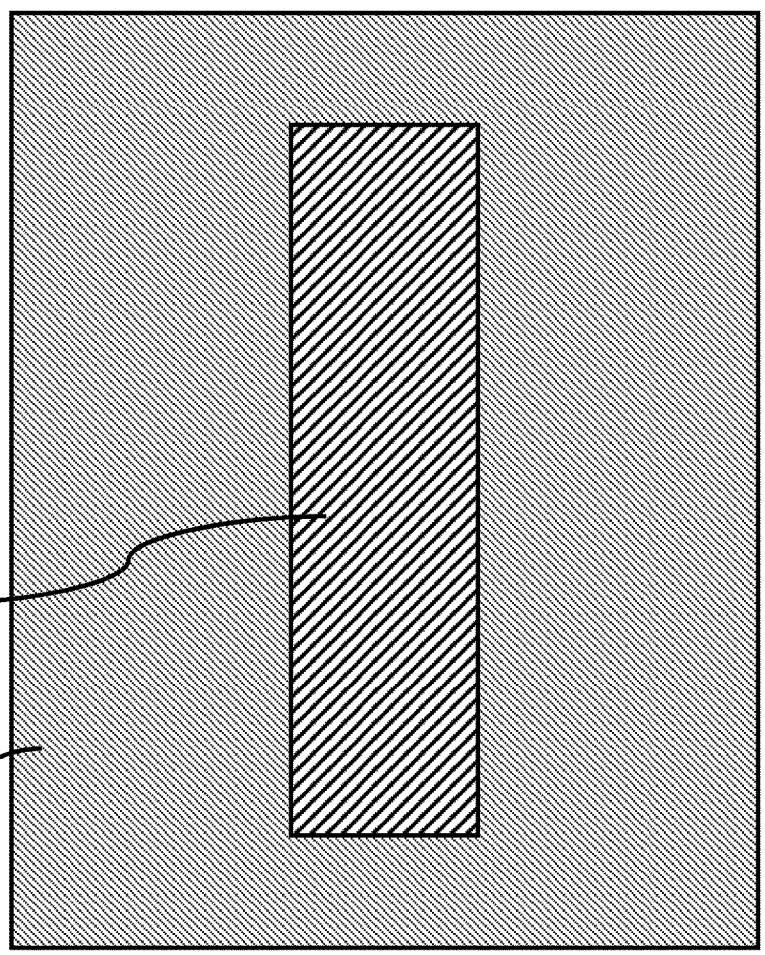
FIG. 5 is a top view showing a cover layer formed on the recessed portion of the substrate around the mesa, in accordance with an embodiment of the present invention.

FIG. 5 is a top view showing a cover layer formed on the recessed portion of the substrate around the mesa, in accordance with an embodiment of the present invention.

In one or more embodiments, a cover layer 130 can be formed on the recessed portions of the substrate 110, where the cover layer 130 can be formed by a directional deposition (e.g., high density plasma (HDP) or gas cluster ion beam (GCIB)). In various embodiments, the cover layer can be silicon oxide ($SiO_2$) or silicon nitride ($Si_3N_4$). The cover layer 130 can be formed on the recessed portion of the substrate 110, where the cover layer 130 surrounds the mesa 115, and is in contact with the sidewalls 118 and endwalls of the mesa 115.

Figure 6:
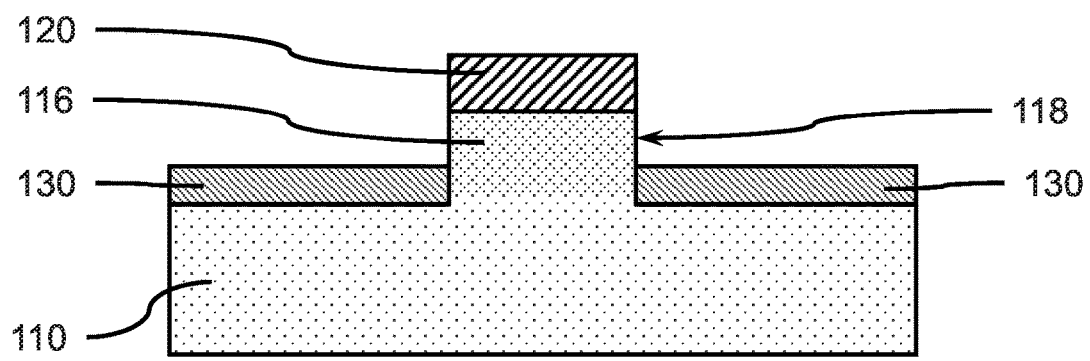
FIG. 6 is a cross-sectional side view showing the cover layer around the mesa on the recessed portion of the substrate, in accordance with an embodiment of the present invention.

FIG. 6 is a cross-sectional side view showing the cover layer around the mesa on the recessed portion of the substrate, in accordance with an embodiment of the present invention.

The cover layer 130 can be formed to a predetermined thickness, where a lower portion of the sidewalls and endwalls 118 of the mesa 115 can be covered by the cover layer 130. In various embodiments, the cover layer 130 can have a thickness in the range of about 0.1 um to about 2 um, where the height can be related to the wavelength of the laser.

In one or more embodiments, a dopant can be introduced into at least a portion of the mesa 115 to form a doped mesa 116, where the dopant can be n-type (e.g., phosphorus, arsenic, etc.) or the dopant can be p-type (e.g., boron, gallium, etc.). The dopant can be introduced into the mesa 115, for example, by ion implantation, gas phase doping, liquid phase doping, solid phase doping, plasma doping, plasma immersion ion implantation, cluster doping, infusion doping, or combinations thereof. The cover layer 130 can protect the substrate from introduction of dopants. The dopant can be introduced into the mesa 115 through the sidewalls and endwalls. The doped mesa 116 can provide an electrical connection for pumping the laser structures, where a laser structure can be formed on opposite sides of the doped mesa 116.

In various embodiments, the doped mesa 116 can have a dopant concentration in the range of about $1 \times 10^{19}$ to about $1 \times 10^{21}$.

Figure 7:
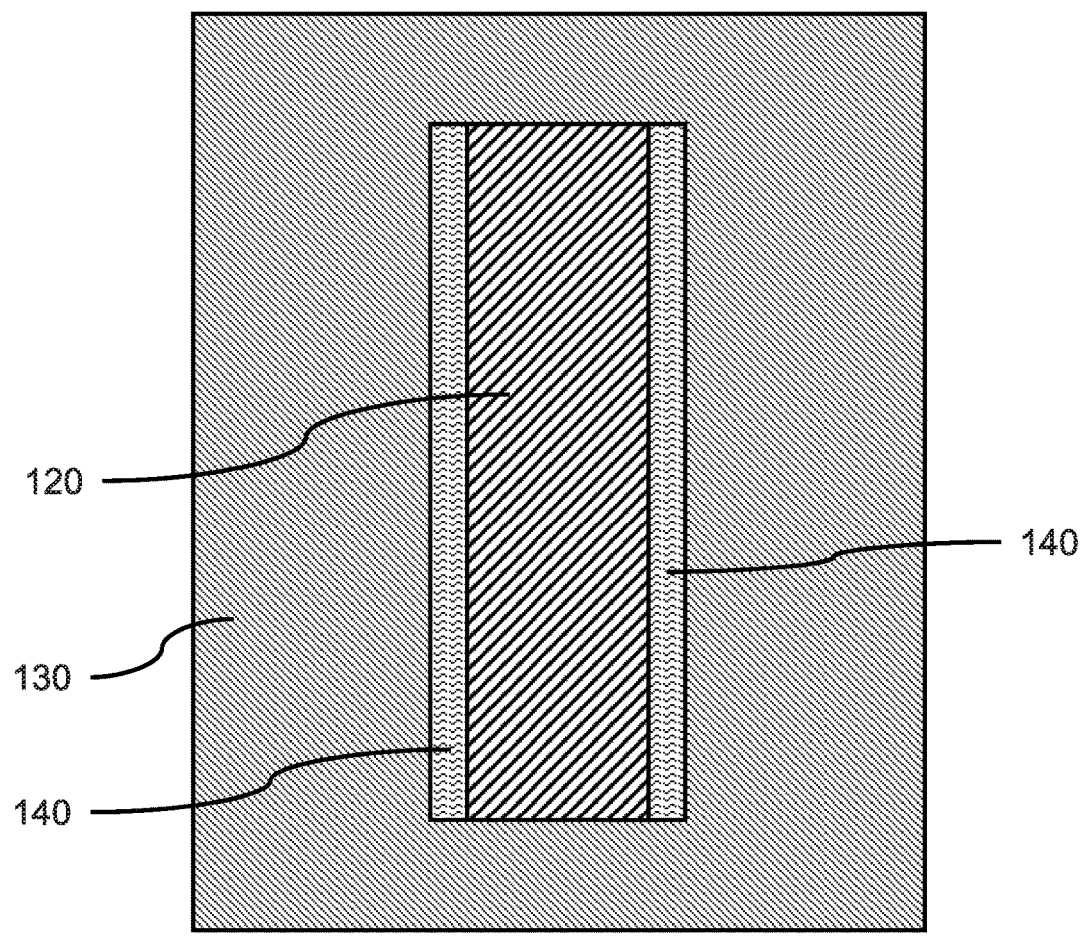
FIG. 7 is a top view showing a first barrier layer formed on each of the exposed sidewall surfaces of the doped mesa, in accordance with an embodiment of the present invention.

FIG. 7 is a top view showing a first barrier layer formed on each of the exposed sidewall surfaces of the doped mesa, in accordance with an embodiment of the present invention.

In one or more embodiments, a first barrier layer 140 can be formed on the doped mesa 116, where the first barrier layer 140 can be formed by heteroepitaxial growth on the sidewalls 118 of the doped mesa 116. The first barrier layer 140 can be formed laterally from the sidewalls 118. The first barrier layer 140 can be formed on the cover layer 130, where the material of the cover layer 130 does not provide an epitaxial growth surface.

In one or more embodiment, the first barrier layer 140 is a III-V semiconductor layer that can form an edge-emitting laser structure. The first barrier layer 140 can be aluminum-gallium-arsenide (AlGaAs), gallium-arsenide-phosphide (GaAsP), aluminum-gallium-nitride (AlGaN), indium-gallium-nitride (InGaN), gallium antimonide (GaSb), and other direct band gap semiconductor materials.

In various embodiments, an endcap can be formed on each of the endwalls of the doped mesa 116 by lithographic masking, deposition, and processing, so the first barrier layer 140 does not form on the endwalls of the doped mesa 116. The endcaps can be a silicon oxide (SiO), silicon oxynitride (SiON), or silicon nitride (SiN).

Figure 8:
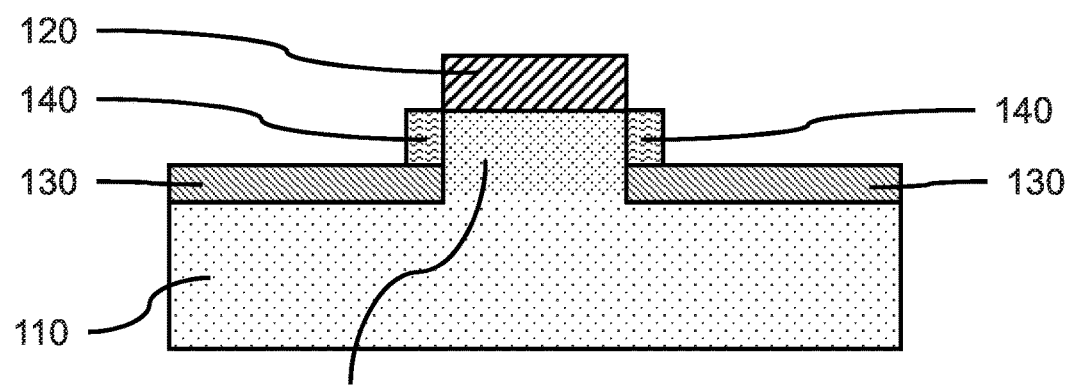
FIG. 8 is a cross-sectional side view showing the first barrier layers formed on opposite sidewalls of the doped mesa, in accordance with an embodiment of the present invention.

FIG. 8 is a cross-sectional side view showing the first barrier layers formed on opposite sidewalls of the doped mesa, in accordance with an embodiment of the present invention.

In one or more embodiments, the width of the first barrier layer 140 can be in the range of about 20 nm to about 50 nm, or in the range of about 30 nm to about 40 nm.

In one or more embodiments, the height of the first barrier layer 140 can be in the range of about 100 nm to about 2000 nm, or in the range of about 500 nm to about 1000 nm.

In one or more embodiments, the first barrier layer 140 can be n-doped or p-doped, where the doping type of the first barrier layer 140 is the same as the dopant type of the doped mesa 116. The first barrier layer 140 can be doped in situ or ex situ. In one or more embodiments, the doped mesa 116 and the first barrier layer 140 are n-doped.

Figure 9:
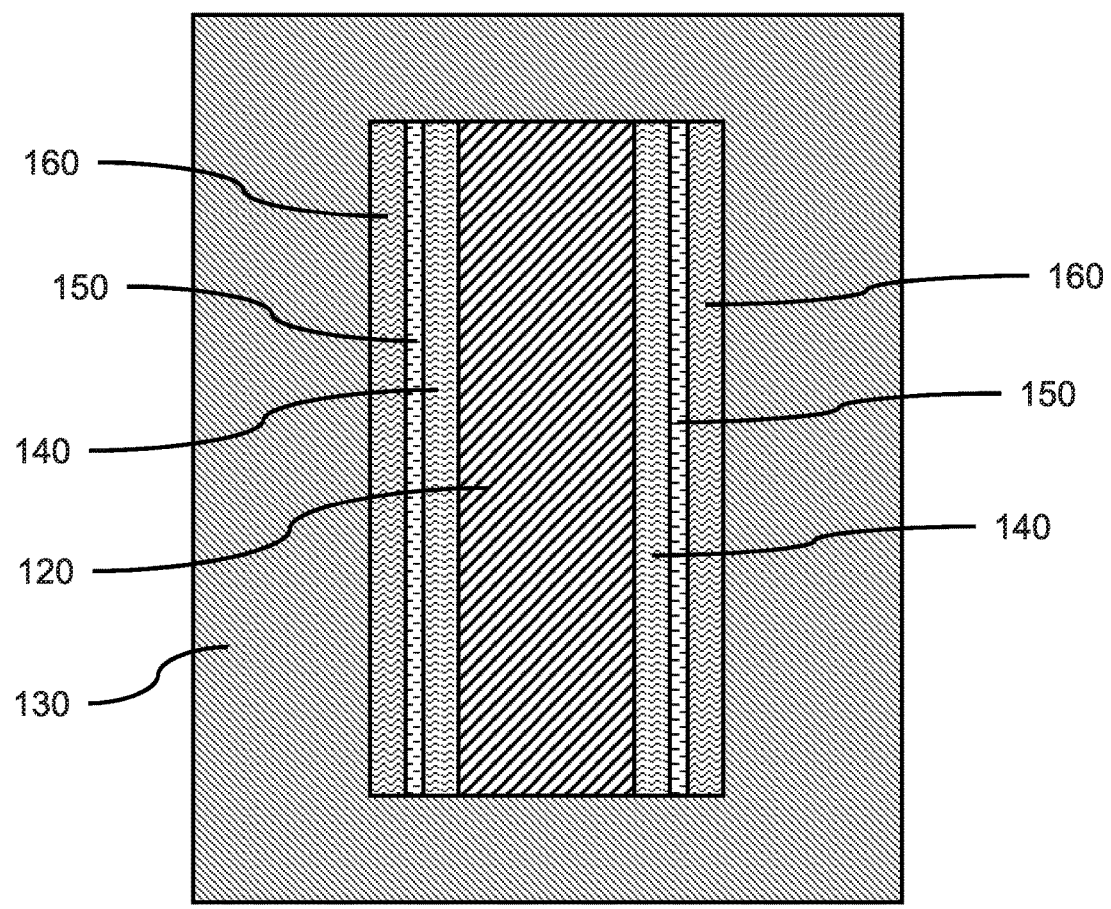
FIG. 9 is a top view showing a quantum well layer formed on the exposed sidewall surfaces of each of the first barrier layers, and a second barrier layer formed on the exposed sidewall surfaces of each of the quantum well layers, in accordance with an embodiment of the present invention.

FIG. 9 is a top view showing a quantum well layer formed on the exposed sidewall surfaces of each of the first barrier layers, and a second barrier layer formed on the exposed sidewall surfaces of each of the quantum well layers, in accordance with an embodiment of the present invention.

In one or more embodiments, a quantum well layer 150 can be formed on the first barrier layer 140, where the quantum well layer 150 can be formed by heteroepitaxial growth on the sidewalls of each of the first barrier layers 140 on opposite sides of the doped mesa 116. The quantum well layer 150 acts as an active laser medium.

In one or more embodiments, the quantum well layer 150 can be indium-gallium-arsenide (InGaAs).

In one or more embodiments, a second barrier layer 160 can be formed on the exposed sidewall surfaces of each of the quantum well layers 150. The second barrier layers 160 can be formed by heteroepitaxial growth on the sidewalls of each of the quantum well layers 150. The material of the second barrier layer 160 can be aluminum-gallium-arsenide (AlGaAs), gallium-arsenide-phosphide (GaAsP), aluminum-gallium-nitride (AlGaN), indium-gallium-nitride (InGaN), gallium antimonide (GaSb), and other direct band gap semiconductor materials. The material of the second barrier layer 160 can be the same as the first barrier layer 140.

In one or more embodiments, the second barrier layer 160 can be n-doped or p-doped, where the doping type of the second barrier layer 160 can be the opposite of the dopant type of the doped mesa 116 and first barrier layer 140. The second barrier layer 160 can be doped in situ or ex situ. In one or more embodiments, the second barrier layers 160 are p-doped, whereas the first barrier layers 140 and doped mesa are n-doped.

In various embodiments, the material of the quantum well layer 150 has a band gap smaller than the band gap of the first barrier layer 140 materials and the second barrier layer 160 material. The first barrier layer 140, quantum well layer 150, and second barrier layer 160 can have low defect densities in the range of about $1 \times 10^2$-$1 \times 10^5$.

Figure 10:
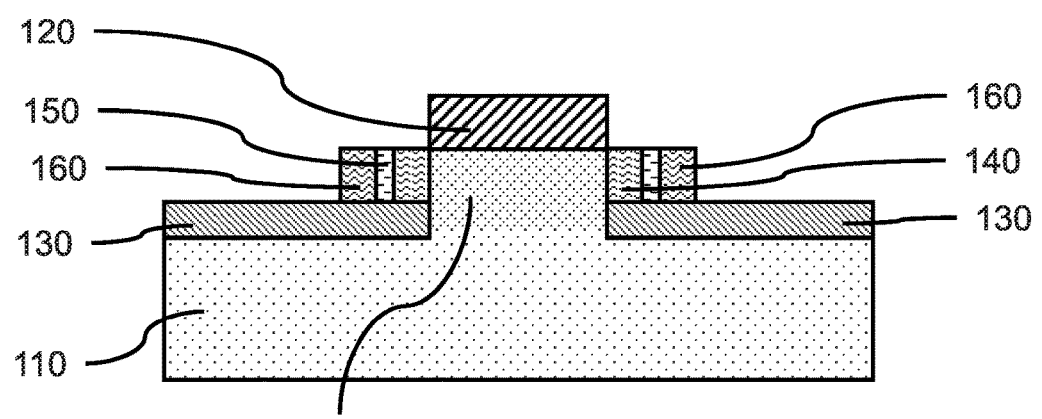
FIG. 10 is a cross-sectional side view showing the quantum well layers formed on the first barrier layers on opposite sides of the doped mesa, and second barrier layers formed on the quantum well layers, in accordance with an embodiment of the present invention.

FIG. 10 is a cross-sectional side view showing the quantum well layers formed on the first barrier layers on opposite sides of the doped mesa, and second barrier layers formed on the quantum well layers, in accordance with an embodiment of the present invention.

In one or more embodiments, the width of the quantum well layer 150 can be in the range of about 5 nm to about 10 nm, or in the range of about 7 nm to about 8 nm. The laser wavelength could be changed by changing the width of the thin quantum well layers. The width of the quantum well layer 150 can be ½ the wavelength of the intended laser radiation. The heterojunctions can form an optical waveguide of the laser structure. The height of quantum well layer 150 can be the same as the first barrier layer.

In one or more embodiments, the width of the second barrier layer 160 can be in the range of about 20 nm to about 50 nm, or about 30 nm to about 40 nm.

In various embodiments, the first barrier layer 140, quantum well layer 150, and second barrier layer 160 can be formed around the doped mesa 116, and a masking and etching process (e.g., RIE) can be used to trim the first barrier layer 140, quantum well layer 150, and second barrier layer 160 from the endwalls of the doped mesa 116.

The barrier layers 140, 160 can form light-guiding layers of an edge-emitting laser structure that confines the field in the transverse direction. The double heterostructure junctions confine both the carriers and photons in a small area to provide a higher photon density in the quantum well layer 150.

The active laser structure is formed by a p-i-n junction, where the double-hetero-structure implementation is formed by two barrier layers 140, 160 sandwiching a quantum well layer 150 formed of an active laser medium (i.e., the intrinsic region), where the quantum well has only discrete energy levels. The barrier layers 140, 160 provide energy barriers that provide quantum confinement of electrons and holes to the active laser medium, where the barrier layers are a material with a wider band gap than the intrinsic region. Electrons and holes are pumped into the intrinsic region (i.e., quantum well layer 150), where the carriers and the photons are confined in order to maximize their chances for recombination and light generation. The quantum well layer 150 width is comparable to the de Broglie wavelength of the carrier.

Figure 11:
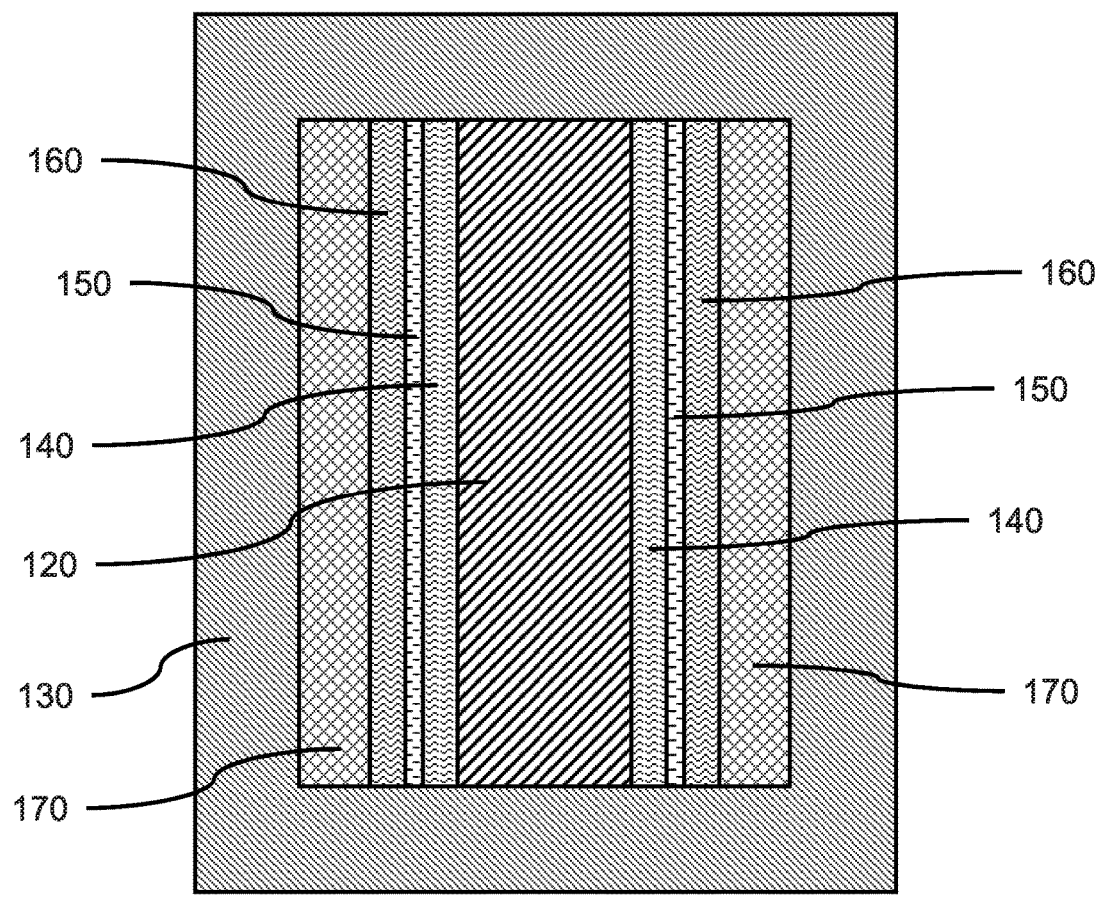
FIG. 11 is a top view showing a cladding layer formed on sidewalls of the second barrier layers, in accordance with an embodiment of the present invention.

FIG. 11 is a top view showing a cladding layer formed on sidewalls of the second barrier layers, in accordance with an embodiment of the present invention.

In one or more embodiments, a cladding layer 170 can be formed on the sidewalls of each of the second barrier layers 160, where the cladding layers 170 can be formed by heteroepitaxial growth on the second barrier layers 160 on opposite sides of the doped mesa 116.

In various embodiments, the cladding layer 170 can be amorphous silicon (a-Si), silicon-germanium (SiGe), silicon carbide (SiC), or a combination thereof. The cladding layer 170 can provide an electrical connection for pumping the laser structures, where a laser structure is formed on each of the opposite sides of the doped mesa 116.

In one or more embodiments, a dopant can be introduced into the cladding layers 170, where the dopant can be n-type (e.g., phosphorus, arsenic, etc.) or the dopant can be p-type (e.g., boron, gallium, etc.), where the dopant can be the same as the second barrier layers 160. The dopant can be introduced into the cladding layer 170 in situ or ex situ. The doping can be accomplished, for example, by gas phase, liquid, or solid phase doping, plasma doping, plasma immersion ion implantation, cluster doping, infusion doping, or combinations thereof. The cover layer 130 can protect the substrate 110 from introduction of the dopant element(s). The dopant can be introduced into the cladding layer 170 through the sidewalls, endwalls, and exposed top surface.

In various embodiments, the cladding layers 170 can have a dopant concentration in the range of about $1 \times 10^{19}$ to about $1 \times 10^{21}$.

The cladding layer 170 can be planarized, for example, by chemical-mechanical polishing (CMP), and patterned through lithographic processes. Portions of the cladding layers 170 can be removed by selective etching (e.g., RIE, wet chemical etch).

Figure 12:
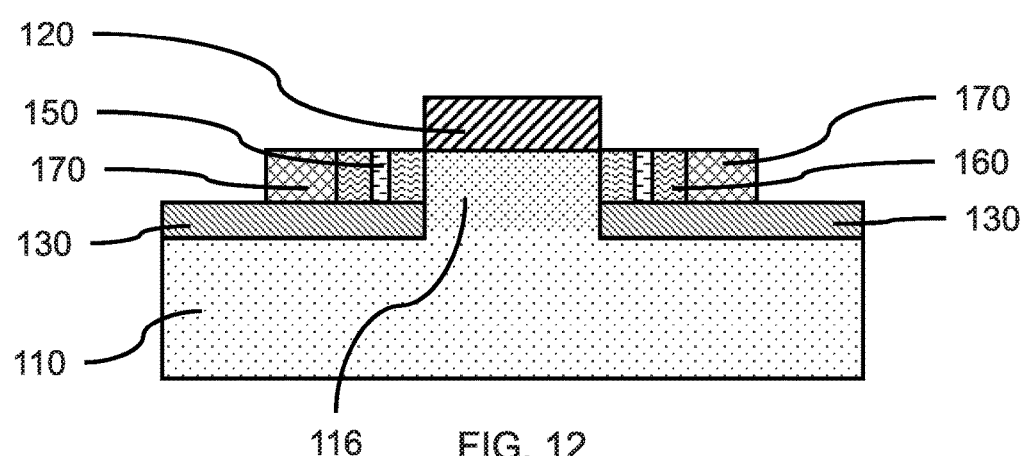
FIG. 12 is a cross-sectional side view showing the cladding layer formed on each of the second barrier layers on opposite sides of the doped mesa, in accordance with an embodiment of the present invention.

FIG. 12 is a cross-sectional side view showing the cladding layer formed on each of the second barrier layers on opposite sides of the doped mesa, in accordance with an embodiment of the present invention.

The cladding layers 170 can have a width in the range of about 0.5 um to about 2 um, or in the range of about 1 um to about 1.5 um. The width of the cladding layer can be tuned to reduce or prevent the leakage of light (e.g., standing wave in the cavity).

The cladding layer 170 can have the same height as the second barrier layers 160, quantum well layers 150, and first barrier layers 140.

Figure 13:
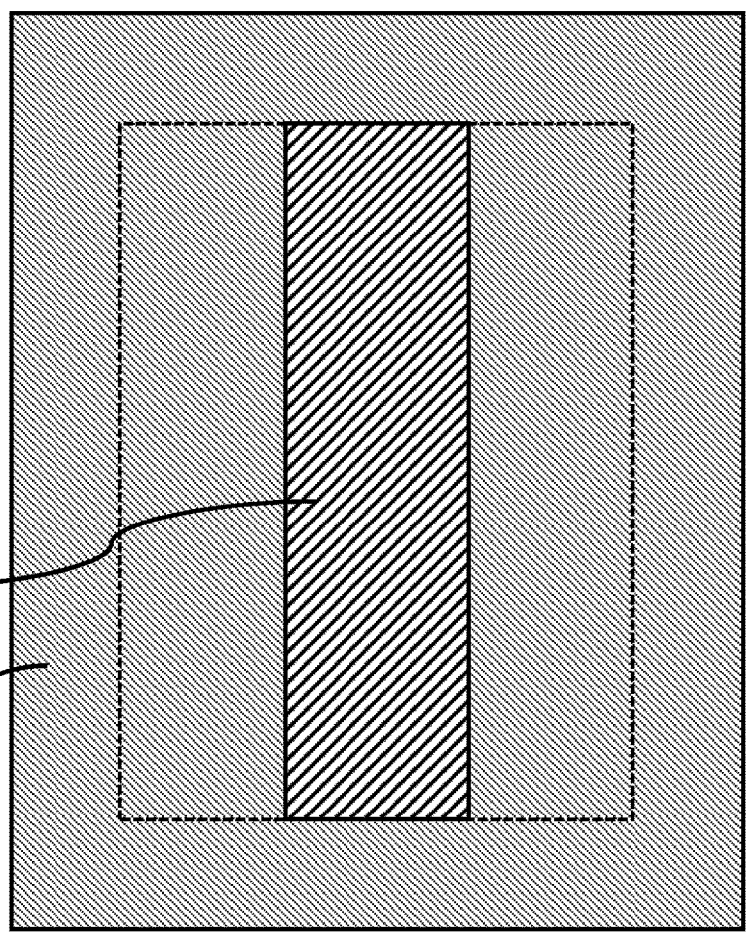
FIG. 13 is a top view showing an interlayer dielectric (ILD) layer formed on the exposed portions of the cover layer, the cladding layer and the laser structure layers, in accordance with an embodiment of the present invention.

FIG. 13 is a top view showing an interlayer dielectric (ILD) layer formed on the exposed portions of the cover layer, the cladding layer and the laser structure layers, in accordance with an embodiment of the present invention.

In one or more embodiments, an interlayer dielectric (ILD) layer 180 can be formed on the exposed portions of the cover layer 130, the cladding layer 170, and the laser structure layers 140, 150, 160. The interlayer dielectric (ILD) layer 180 can be formed by a blanket deposition, for example, chemical vapor deposition (CVD), plasma enhanced CVD (PECVD), spin-on-processes, or a combination thereof.

In various embodiments, the ILD layer 180 can be silicon oxide ($SiO_2$) or silicon nitride ($Si_3N_4$), where the ILD layer 180 can be the same material as the cover layer 130.

Figure 14:
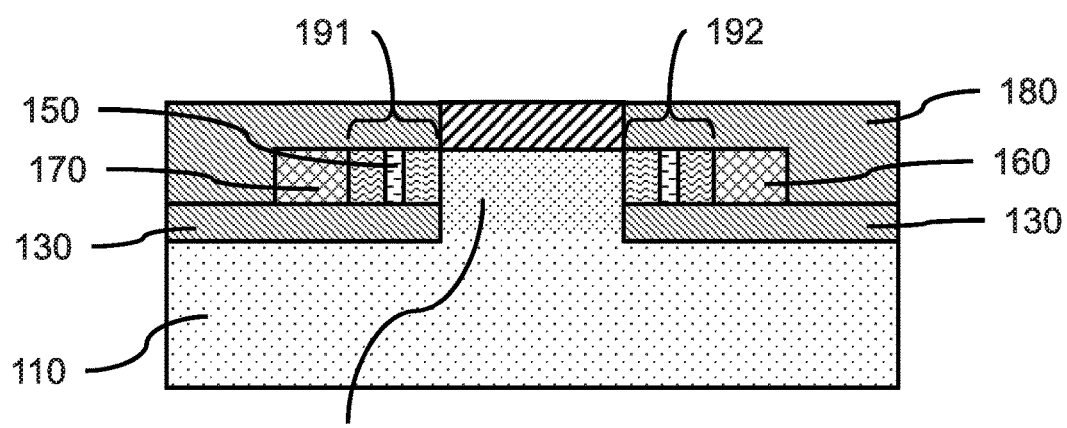
FIG. 14 is a cross-sectional side view showing the interlayer dielectric layer formed on the exposed portions of the cover layer, the cladding layer and the laser structure layers, in accordance with an embodiment of the present invention.

FIG. 14 is a cross-sectional side view showing the interlayer dielectric layer formed on the exposed portions of the cover layer, the cladding layer and the laser structure layers, in accordance with an embodiment of the present invention.

In various embodiments, the ILD layer 180 can be deposited over the cover layer 130, the cladding layer 170, the laser structures 191, 192, and the hardmask 120, and a CMP can be used to remove a portion of the ILD layer 180 and planarize the exposed ILD layer surface. The hardmask 120 can be exposed after planarizing the ILD layer 180.

A first laser structure 191 can be formed on a first side of the doped mesa 116, and a second laser structure 192 can be formed on a second side of the doped mesa 116 opposite the first side. The laser structures 191, 192 can include the laser structure layers 140, 150, 160. The laser structures 191, 192 can be formed at the same time.

Figure 15:
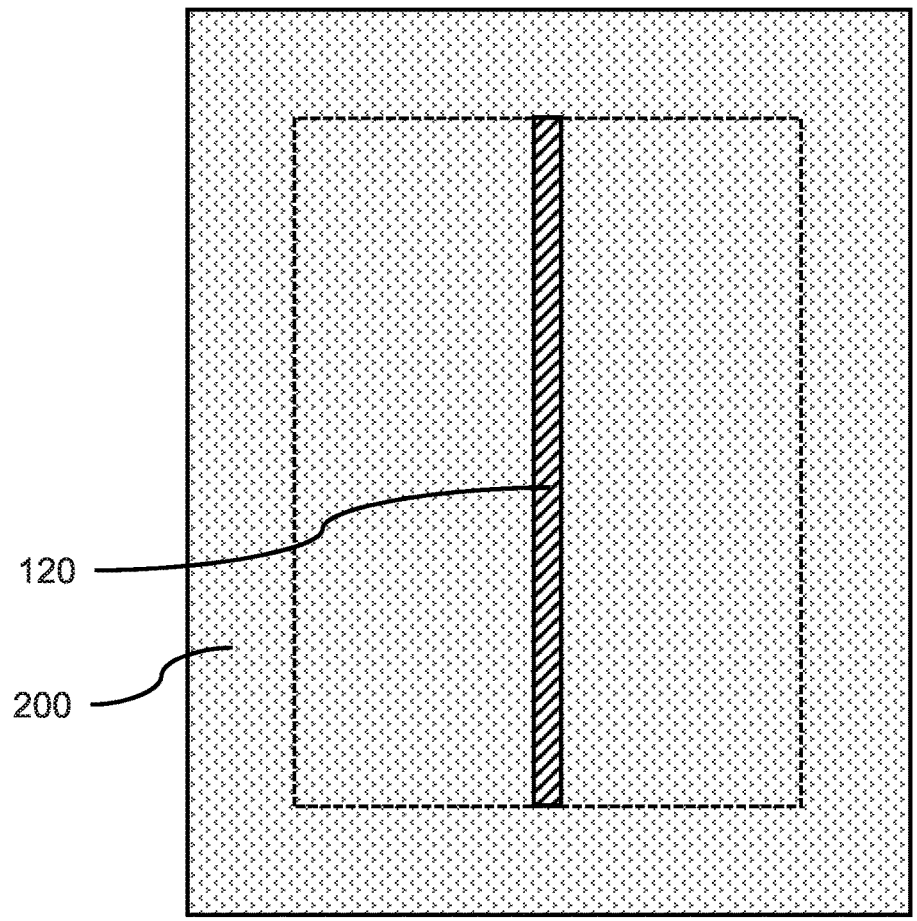
FIG. 15 is a top view showing a masking layer formed on portions of the ILD layer to form a trench over the hardmask and mesa, in accordance with an embodiment of the present invention.

FIG. 15 is a top view showing a masking layer formed on portions of the ILD layer to form a trench over the hardmask and mesa, in accordance with an embodiment of the present invention.

In one or more embodiments, a masking layer 200 can be formed on the ILD layer 180 and hardmask 120, where a portion of the hardmask 120 is exposed. The masking layer 200 can be a lithographic resist material that can be patterned to form a trench 205 parallel with the long axis of the hardmask 120 and laser structure layers 140, 150, 160.

Figure 16:
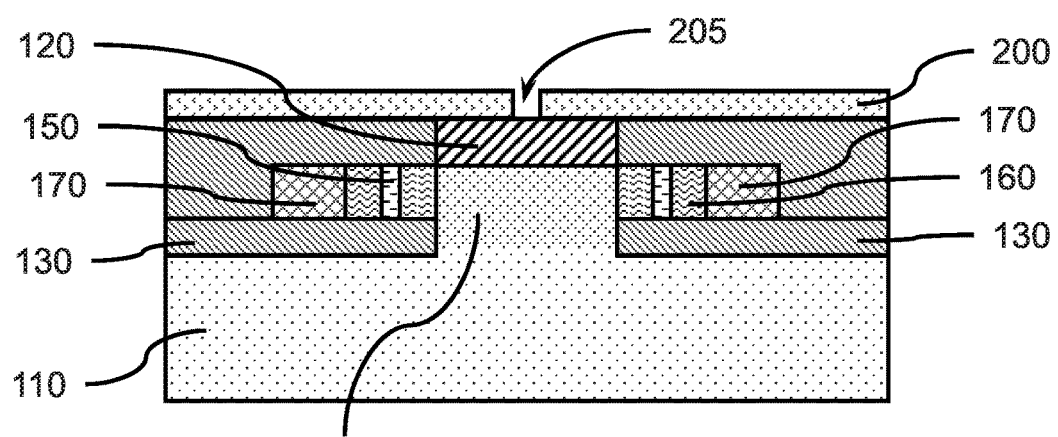
FIG. 16 is a cross-sectional side view showing the trench over the hardmask and mesa, in accordance with an embodiment of the present invention.

FIG. 16 is a cross-sectional side view showing the trench over the hardmask and mesa, in accordance with an embodiment of the present invention.

In one or more embodiments, the trench 205 can have a width in the range of about 10 nm to about 200 nm, or in the range of about 50 nm to about 100 nm.

Figure 17:
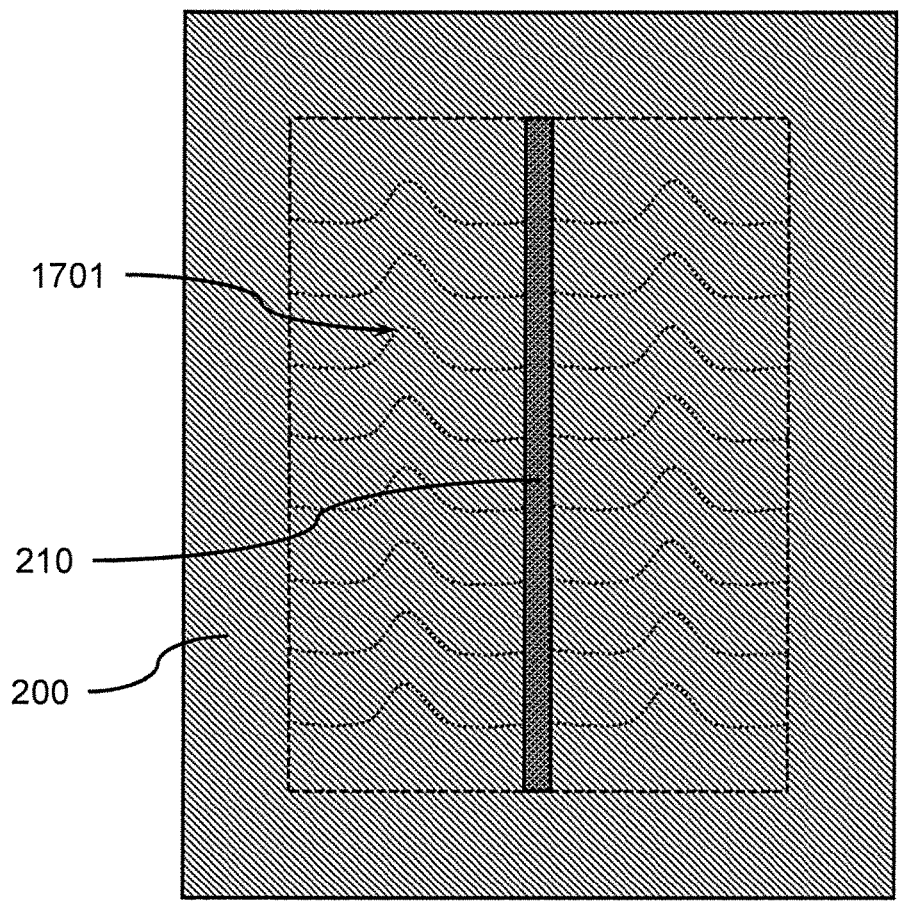
FIG. 17 is a top view showing a mirror formed in a channel in the hardmask and mesa, in accordance with an embodiment of the present invention.

FIG. 17 is a top view showing a mirror formed in a channel in the hardmask and mesa, in accordance with an embodiment of the present invention.

In one or more embodiments, a channel can be formed in the hardmask 120 and doped mesa 116, where the channel can extend to a depth greater than the depth of the dopant in the mesa. In various embodiments, the channel can extend into the substrate 110. The channel can be formed by a selective directional etch (e.g., RIE).

In one or more embodiments, a mirror 210 can be formed in the channel, where the mirror can be formed by a directional deposition, for example, a directional high density plasma (HDP). The mirror 210 can be aligned with the long axis of the doped mesa 116 and the laser structure layers 140, 150, 160.

In various embodiments, the mirror 210 can be made of a material with a different dielectric constant than the adjoining material of the doped mesa 116. In various embodiments, the material forming the mirror 210 can have a lower dielectric constant than the adjoining material of the doped mesa 116. The mirror 210 can be made of silicon oxide (SiO), silicon nitride (SiN), or a high-k dielectric material, for example, hafnium oxide (HfO), tantalum oxide (TaO), or titanium oxide (TiO).

A transverse wave 1701 can be formed in the laser structure, where the wave has a peak in the quantum well layer 150. The wavefunctions of the bound states are sine waves inside the quantum well layer 150, and are exponentially decaying in the barriers layers 140, 160.

Figure 18:
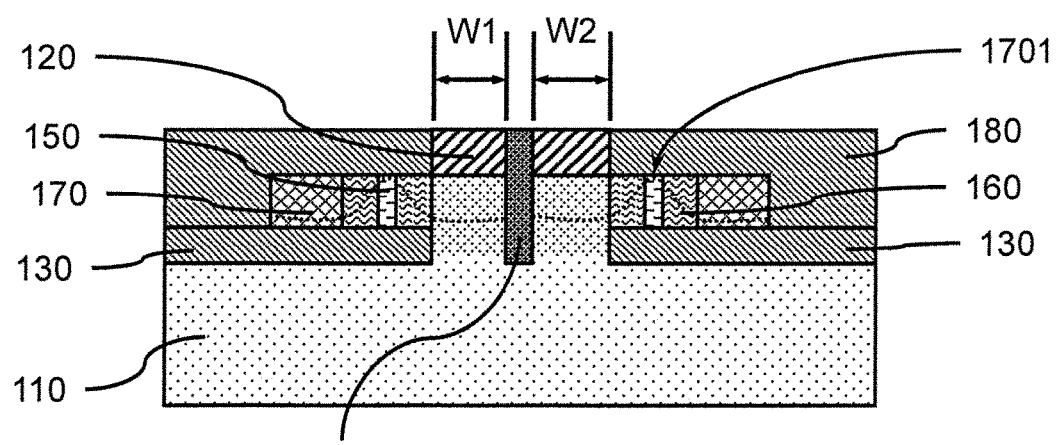
FIG. 18 is a cross-sectional side view showing the mirror in the hardmask and mesa that extends to the substrate, in accordance with an embodiment of the present invention.

FIG. 18 is a cross-sectional side view showing the mirror in the hardmask and mesa that extends to the substrate, in accordance with an embodiment of the present invention.

In various embodiments, the mirror may be centered between the first barrier layers 140, where the widths, W1, W2, of the doped mesa are the same on both sides of the mirror 210 (W1=W2). In various embodiments, the mirror may not be centered between the first barrier layers 140, where the widths, W1, W2, of the doped mesa are different on each side of the mirror 210 (W1≠W2). The width, W1, of doped mesa 116 on one side of the mirror can be greater than the width, W2, on the opposite side of the mirror 210, where the difference in widths allow tuning of the laser structure cavities. The mirror 210 can extend through the doped mesa 116 to the substrate 110.

Figure 19:
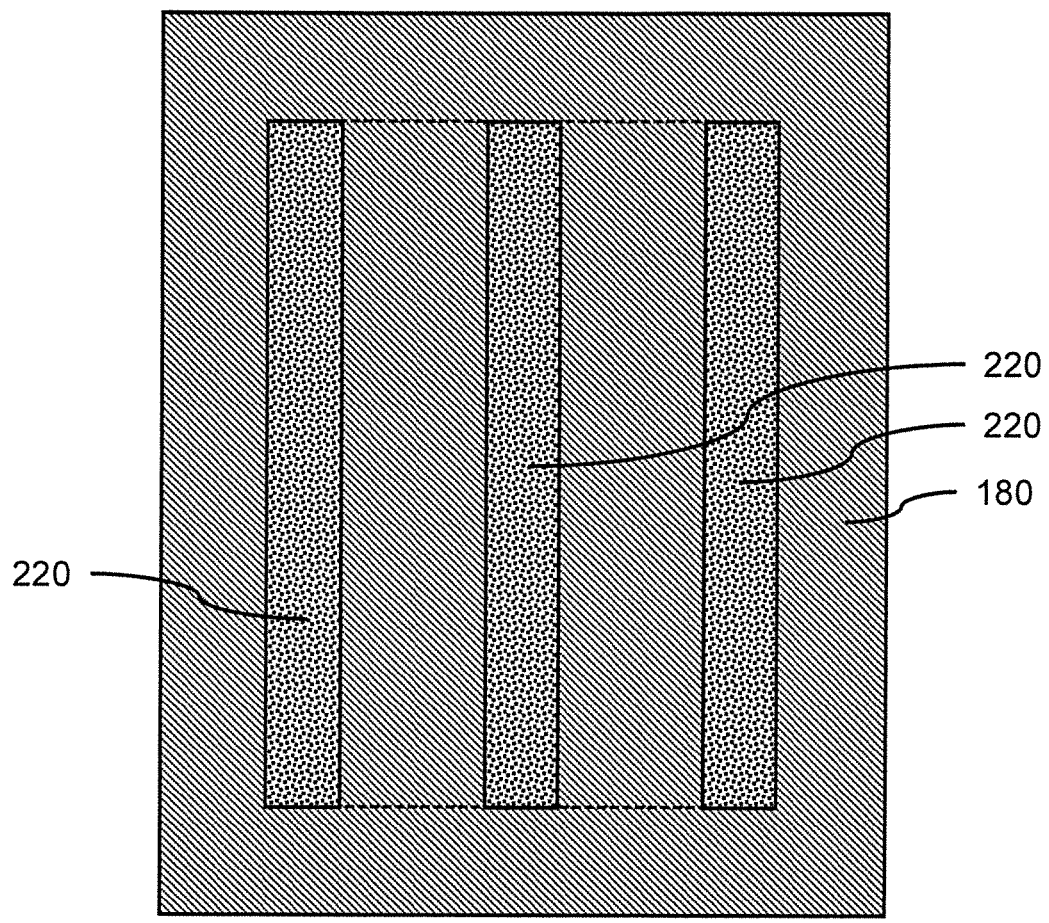
FIG. 19 is a top view showing electrical contacts formed to the doped mesa and each of the cladding layers on the laser structures on opposite sides of the mirror, in accordance with an embodiment of the present invention.

FIG. 19 is a top view showing electrical contacts formed to the doped mesa and each of the cladding layers on the laser structures on opposite sides of the mirror, in accordance with an embodiment of the present invention.

In one or more embodiments, electrical contacts 220 can be formed to the doped mesa 116 and each of the cladding layers 170 on the laser structures 191, 192 on opposite sides of the mirror 210. The electrical contact can allow passage of a current to electrically pump the laser structures 191, 192. Electrons and holes can be injected into the layers of the laser structures 191, 192, where the electrons and holes are confined to the smaller band gap semiconductor of the quantum well layer 150. In various embodiments, the voltage applied across the laser structures 191, 192 can be in the range of about 1 V (volt) to about 1.2 V to initiate laser pumping, and a higher voltage during operation of about 1.4 V to about 2 V for a strained InGaAs quantum well layer 150.

Figure 20:
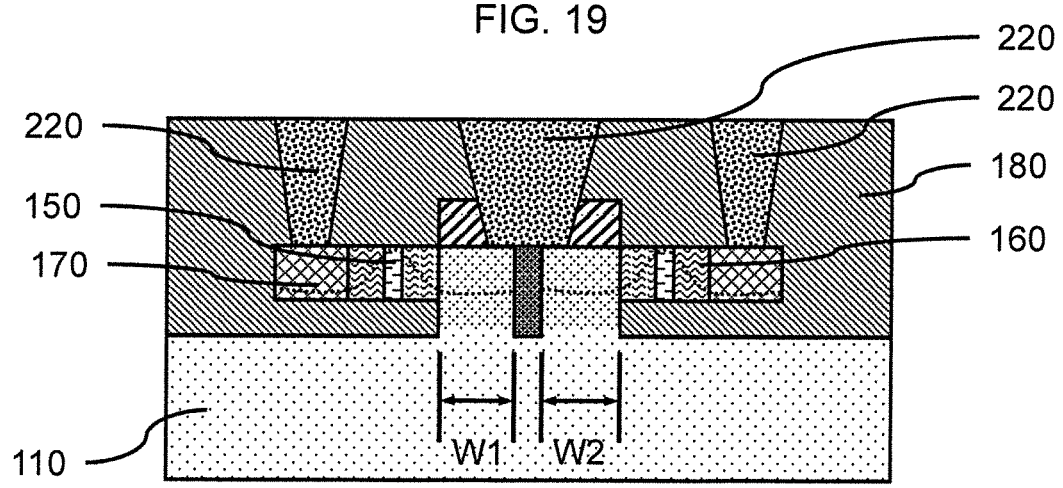
FIG. 20 is a cross-sectional side view showing the electrical contacts formed to the doped mesa and each of the cladding layers on the laser structures on opposite sides of the mirror, in accordance with an embodiment of the present invention.

FIG. 20 is a cross-sectional side view showing the electrical contacts formed to the doped mesa and each of the cladding layers on the laser structures on opposite sides of the mirror, in accordance with an embodiment of the present invention.

In various embodiments, the wavelength of the light emitted from the laser structures 191, 192 can be in the range of about 850 nm to about 1.1 um, depending on the material and width of the quantum well layer 150. The laser light propagates in a direction along the long axis of the doped mesa 116.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or including, when used herein, specify the presence of stated features, integers, steps, operations, elements and/or components, but do not preclude the presence or addition of one or ore other features, integers, steps, operations, elements, components and/or groups thereof.

Spatially relative terms, such as "beneath," "below," "lower," "above" "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a pair of edge-emitting lasers, comprising:
    forming a mesa from a substrate, wherein the mesa has essentially straight sidewalls with a predetermined crystal face;
    forming a cover layer on the substrate around the mesa;
    forming a first barrier layer directly on and laterally from each of opposite sidewalls of the mesa;
    forming a quantum well layer on each of the barrier layers;
    forming a second barrier layer on each of the quantum well layers; and
    forming a cladding layer on each of the second barrier layers.

2. The method of claim 1, further comprising forming a mirror in the mesa.

3. The method of claim 1, further comprising doping the mesa with an n-type or a p-type dopant, and doping the first barrier layers with the same type of dopant as the mesa.

4. The method of claim 1, further comprising forming electrical contacts to each of the cladding layers and the mesa.

5. The method of claim 1, wherein the first barrier layers and second barrier layers are made of aluminum-gallium-arsenide (AlGaAs).

6. The method of claim 1, wherein the quantum well layers are made of indium-gallium-arsenide (InGaAs).

7. The method of claim 1, wherein the quantum well layers each have a width in the range of about 5 nm to about 10 nm.

8. The method of claim 1, wherein the first barrier layers are formed on the opposite sidewalls of the mesa by heteroepitaxial growth, and wherein the first barrier layer is in physical contact with the cover layer.

9. The method of claim 8, wherein the quantum well layers are formed on the first barrier layers by heteroepitaxial growth.

10. The method of claim 9, wherein the mesa is single crystal silicon, and the sidewalls of the mesa have a {111} crystal face.

11. A method of forming a pair of edge-emitting lasers, comprising:
    forming a mesa from a substrate, wherein the mesa has essentially straight sidewalls with a predetermined crystal face;
    doping the mesa with an n-type or a p-type dopant;
    forming a cover layer on the substrate around the mesa;
    forming a first barrier layer directly on each of opposite sidewalls of the mesa, wherein the first barrier layers are formed by lateral heteroepitaxial growth from opposite sidewalls of the mesa;
    forming a quantum well layer on each of the barrier layers; and
    forming a second barrier layer on each of the quantum well layers.

12. The method of claim 11, further comprising forming a cladding layer on each of the second barrier layers, wherein the first barrier layer and the cladding layer are in physical contact with the cover layer.

13. The method of claim 12, wherein the quantum well layers are formed on the first barrier layers by heteroepitaxial growth.

14. The method of claim 13, wherein the doped mesa is single crystal silicon, and the sidewalls of the mesa have a {111} crystal face.

15. The method of claim 14, further comprising forming a mirror in the doped mesa, wherein the mirror is between the first barrier layers.

16. A pair of edge-emitting lasers, comprising:
a doped mesa extended from a substrate, wherein the mesa has essentially straight sidewalls with a predetermined crystal face, and wherein the doped mesa forms part of a waveguide for the pair of edge-emitting lasers;
a cover layer on the substrate around the doped mesa;
a first barrier layer directly on each of opposite sidewalls of the doped mesa;
a quantum well layer on each of the barrier layers; and
a second barrier layer on each of the quantum well layers.

17. The pair of edge-emitting lasers of claim 16, further comprising a cladding layer on each of the second barrier layers, wherein the first barrier layer and the cladding layer are in physical contact with the cover layer.

18. The pair of edge-emitting lasers of claim 16, wherein each of the first barrier layers have a width in the range of about 20 nm to about 50 nm.

19. The pair of edge-emitting lasers of claim 16, wherein each of the quantum well layers have a width in the range of about 5 nm to about 10 nm.

20. The pair of edge-emitting lasers of claim 16, further comprising a mirror in the doped mesa, wherein the mirror is aligned with a long axis of the doped mesa.

* * * * *